United States Patent [19]

Dehganpour et al.

[11] Patent Number: 4,800,531
[45] Date of Patent: Jan. 24, 1989

[54] ADDRESS BUFFER CIRCUIT FOR A DRAM

[75] Inventors: Sam Dehganpour; Perry H. Pelley, III, both of Austin, Tex.

[73] Assignee: Motorola, Inc., Schaumburg, Ill.

[21] Appl. No.: 944,784

[22] Filed: Dec. 22, 1986

[51] Int. Cl.$^4$ .......................... G11C 7/00; G11C 8/00
[52] U.S. Cl. .................................. 365/222; 365/230; 365/203
[58] Field of Search ...................... 365/222, 230, 203; 307/475, 448, 449, 451, 452, 463

[56] References Cited

U.S. PATENT DOCUMENTS

| | | | |
|---|---|---|---|
| 4,451,745 | 5/1984 | Itoh et al. | 307/475 |
| 4,672,583 | 6/1987 | Nakaizumi | 365/222 |
| 4,677,593 | 6/1987 | Davis | 365/230 |
| 4,712,197 | 12/1987 | Sood | 365/230 |

*Primary Examiner*—Stuart N. Hecker
*Assistant Examiner*—Glenn A. Gossage
*Attorney, Agent, or Firm*—James L. Clingan, Jr.

[57] ABSTRACT

A DRAM has an input address buffer in which the first stage is a NOR gate. The output of the NOR gate is clocked to a latch which is preset to the slow condition of the NOR gate. The NOR gate is clocked separately from the clocking of the output of the NOR gate to the latch. A refresh control circuit has an output which is also clocked to the latch. The latch provides an internal address signal for selecting a word line. The internal address signal is representative of the output of the NOR gate when the DRAM is running a data cycle and is representative of the output of the refresh control circuit when the DRAM is running a refresh cycle.

9 Claims, 2 Drawing Sheets

ADDRESS BUFFER CIRCUIT FOR A DRAM

FIELD OF THE INVENTION

The present invention relates to dynamic random access memories (DRAMs), and more particularly, to an address buffer circuit for use in a DRAM.

BACKGROUND OF THE INVENTION

In typical dynamic random access memories (DRAMs) there is a multiplexed address. The row address is received first. The row address selects a word line to be enabled. Each memory cell along the enabled word line couple data to a bit line to which it is coupled. A sense amplifier detects the data and amplifies it on the bit line and in so doing refreshes the data in the enabled cell. An access thus begins with a row address. There are buffers which receive this address. These address buffers, although necessary for reliable operation of the DRAM, cause a delay. Additionally these address buffers are clocked by a signal which is derived from an externally provided signal, *RAS. In a conventional input buffer of the prior art, the initial stage, after the input protection, was a two-input NAND gate. One input was for the clock signal and the other was for the address signal. Other buffering circuits comprised primarily of inverters followed this initial stage. The worst case delay was for the case in which both the address and this clock signal simultaneously switched from a logic low to a logic high. In a NAND gate there are two N channel transistors in series with each other which become conductive for this case. These two N channel transistors in series becoming simultaneously conductive was slower than any of the other combinations of transitions. With two signals having two possible states, there are four possible conditions. To compensate for this one weakest condition, a technique was developed to precharge a node in the input chain to the logic state which results from both inputs being a logic high. Consequently, the input buffer would thus already be in the condition which would otherwise be the slowest condition to reach.

Another characteristic of DRAMs is that the memory cells must all be periodically refreshed. A typical refresh requirement for a DRAM cell for reliable operation is once every 4 milliseconds (ms). Consequently, every memory cell must be refreshed every 4 ms. This is achieved by enabling all of the word lines at least once every 4 ms. One way this can be achieved is by requiring the user of the DRAM to ensure that all of the word lines are enabled at least once every 4 ms. Another approach that is well known is to include an onboard counter for refresh purposes. The DRAM would then run either a data cycle or a refresh cycle. A data cycle was one in which data was either input to or output from the DRAM. A refresh cycle was a cycle for refreshing the memory cells along a word line or word lines corresponding to a single row address. The on-board counter was used for generating the proper row addresses for selecting the word lines for refreshing purposes. Because internal refresh was used in conjunction with the row address, there tended to be extra delay in the address buffer. The addresses generated from the refresh counter circuitry interfered with the normal address buffer input path. There were also timing differentials which caused problems in design and layout in order to match various delays.

SUMMARY OF THE INVENTION

An object of the present invention is to provide an improved address buffer for a DRAM.

Another object of the invention is to provide an improved DRAM which has an automatic refresh feature.

Yet another object of the invention is to provide an improved address buffer for use in a DRAM which has an automatic refresh feature.

These and other objects are achieved in an integrated circuit memory having an array requiring periodic refreshing and having a counter for providing address information for controlling refresh of the array, and an input buffer for receiving an external address signal at one of two logic states. The input buffer comprises a CMOS NOR gate, a coupling circuit, and a precharge circuit. The CMOS NOR gate has a first input for receiving a first control signal, a second input for receiving the external address signal, and an output. The NOR gate is characterized as providing information, in the form of a logic state on the output, as to the logic state of the external address signal when the first control signal is a logic low. The coupling circuit has a first input coupled to the output of the NOR gate, a second input for receiving a second control signal, and an output coupled to a precharge node, for coupling a logic state to the precharge node representative of the logic state present on the output of the NOR gate when the control signal is received. The precharge circuit is for precharging, in response to a precharge signal, the precharge node to the logic state which is coupled to the precharge node when the address signal and the first control signal are a logic low and the second control signal is received by the coupling means.

DESCRIPTION OF THE INVENTION

Figure 1:
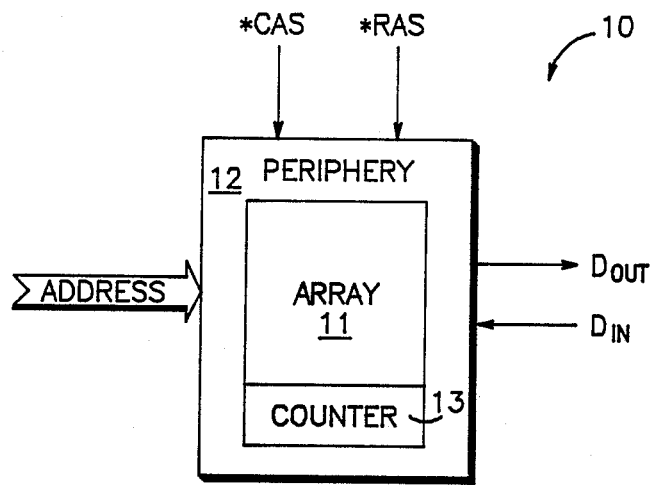
FIG. 1 is a block diagram of a DRAM of the prior art.

Shown in FIG. 1 is a dynamic random access memory (DRAM) 10 of the prior art comprised generally of an array 11 of memory cells, and a periphery 12. Array 11 contains memory cells which require periodic refreshing. The periphery includes conventional circuits, not individually shown, present in a DRAM such as clock generators, address input buffers, a data input buffer, a data output buffer, a column decoder, and a row decoder. Also included in periphery 12 is a counter 13, also conventional, for use in providing an automatic refresh function. DRAM 10 receives an address, clock signals *CAS and *RAS, and a data output signal $D_{out}$, a data input signal $D_{in}$. An asterisk (*) before a signal designation indicates that the signal is active at a logic low. The address is comprised of a row address and a column address which are sequentially received. Memory array 11 is comprised of memory cells located at intersections of word lines and bit lines.

The memory cells are refreshed when the word line to which they are connected are enabled. One or more word lines are enabled for a given address. All of the word lines will be enabled if all of the possible row address combinations are received. For a typical DRAM such as DRAM 10, all of the cells must be refreshed within 4 ms. Thus if all of the combinations of the row address are received within 4 ms, the array has been adequately refreshed. For refresh to occur using the row address, the user of DRAM 10 must keep track of the row addresses that have been applied in order to ensure that all of the memory cells are refreshed within the required time. This is normally done with a counter. DRAM 10 includes a counter which can be used for an automatic refresh function. DRAM 10 will run what is known as a data, or normal, cycle if clock signal *RAS is received before clock signal *CAS is received. In a data cycle, DRAM 10 will either provide data output signal $D_{out}$ at a logic state representative of the data stored at the location addressed or write data representative of input data signal $D_{in}$. DRAM 10 will run a refresh cycle if clock signal *CAS is received before *RAS is received. In a refresh cycle, counter 13 provides the information necessary to determine what word line or word lines are enabled.

Figure 2:
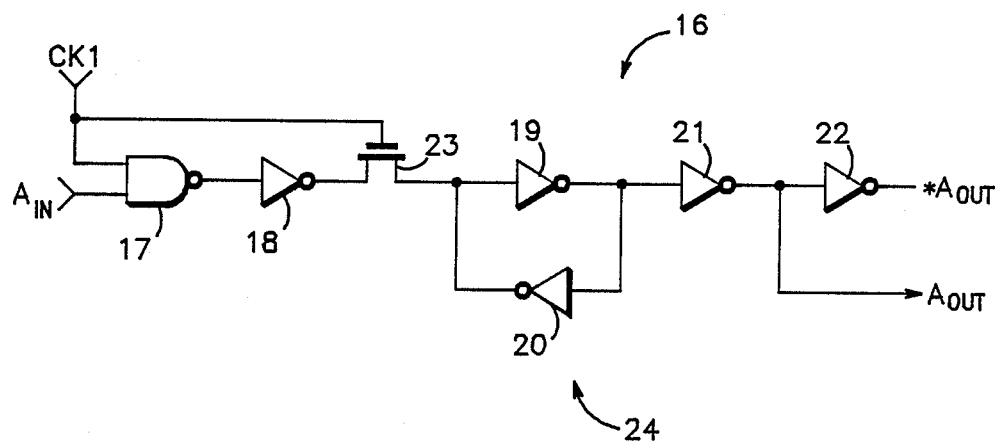
FIG. 2 is a circuit diagram of an input buffer, for use in the DRAM of FIG. 1, according to the prior art.

Shown in FIG. 2 is a conventional address input buffer 16 comprised generally of a NAND gate 17, an inverter 18, an inverter 19, an inverter 20, an inverter 21, an inverter 22, and an N channel transistor 23. NOR gate 17 has a first input for receiving external address signal $A_{in}$, a second input for receiving a clock signal CK1, and an output. Inverter 18 has an input connected to the output of NAND gate 17, and an output. Transistor 23 has a first current electrode connected to the output of inverter 18, a control electrode for receiving clock signal CK1,, and a second current electrode. Transistor 23 is used so as to take advantage of the bilateral nature of insulated gate field effect transistors in which the junctions of source and drain are interchangeable current electrodes. Inverter 19 has an input connected to the source of transistor 23. Inverter 20 has an input connected to the output of inverter 19, and an output connected to the input of inverter 19. Inverter 21 has an input connected to the output of inverter 19, and an output for providing buffered address signal $A_{out}$. Inverter 22 has an input connected to the output of inverter 21, and an output for providing complementary buffered address signal $*A_{out}$.

Signal CK1 is an internal clock signal derived from signal *RAS. When signal *RAS becomes active by switching to a logic low, signal CK1 responds by switching to a logic high as a logic high pulse. NAND gate 17 is responsive to signal $A_{in}$ while signal CK1 is a logic high. In such case the output of NAND gate 17 is representative of that of signal $A_{in}$ which in turn causes inverter 18 to provide an output representative of the logic state of signal $A_{in}$. With signal CK1 at a logic high, transistor 23 is conductive so that the output of inverter 18 is coupled to the input of inverter 19. Inverters 19 and 20 form a latch 24 so that the output of inverter 18 that is present while signal CK1 is a logic high is latched by latch 24. Inverter 21 responds to the output of inverter 19, which is also the output of latch 24, by providing internal address signal $A_{out}$ which is the logic true output of buffer 16. Inverter 22 responds to the output of inverter 21 by providing internal address signal $*A_{out}$ which is a logic complement output of buffer 16.

Signal CK1 thus first clocks a row address signal into latch 24 when it first pulses to a logic high. Signal CK1 then pulses to a logic low. Latch 24 holds this row address information until signal CK1 again pulses to a logic high to clock in a signal of the column address.

Thus the first pulse of signal CK1 clocks in the row address of DRAM 10 and the second pulse clocks in the column address. The slowest condition of buffer 16 is when both signal $A_{in}$ and CK1 switch to a logic high because there are two transistors of NAND gate 17 which are in series which must become conductive at the same time. In order to compensate for this, latch 24 can be preset to the condition which results from that slowest condition which would be to preset latch 24 to provide a logic low output.

Figure 3:
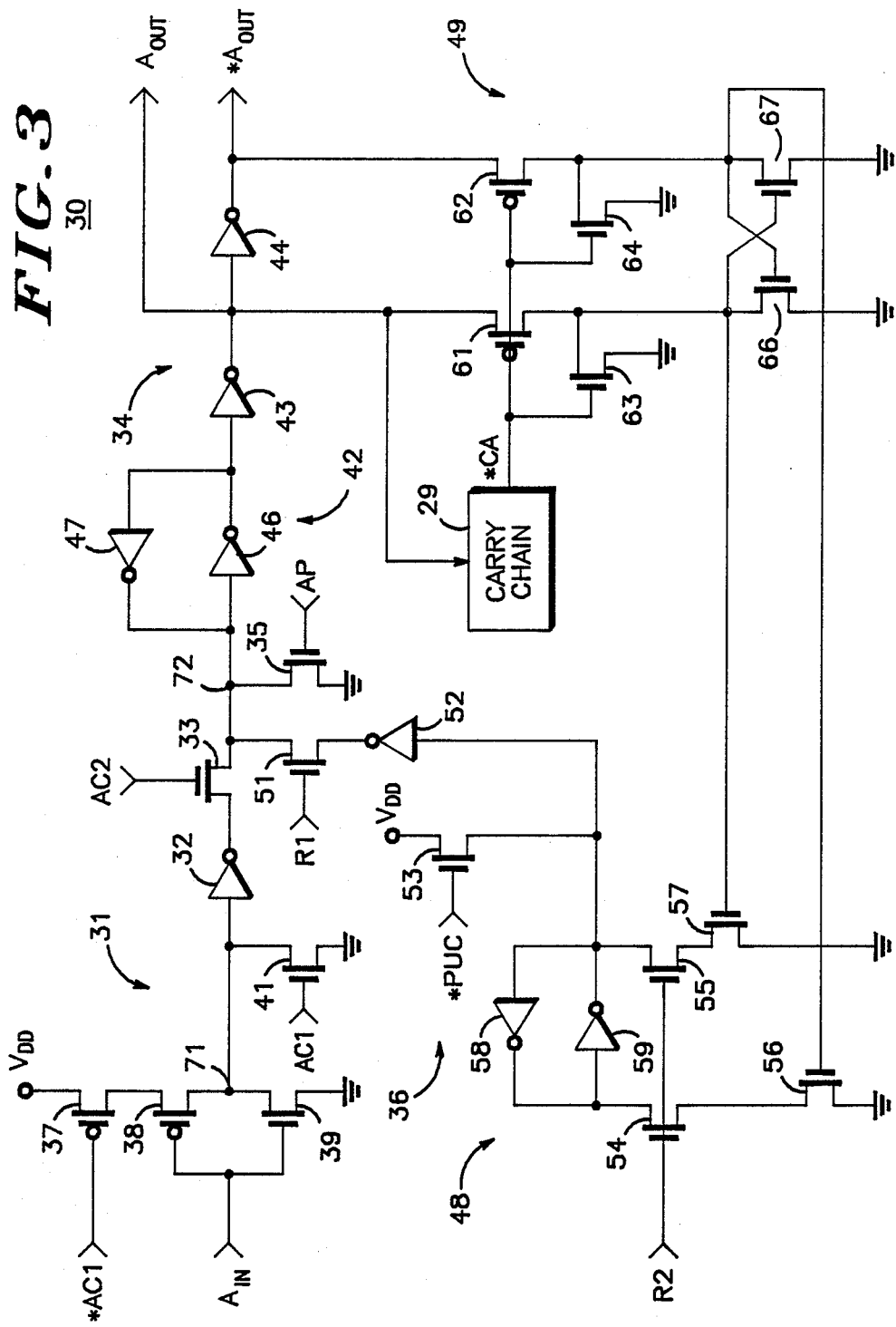
FIG. 3 is a circuit diagram of an input buffer according to a preferred embodiment of the invention for replacing the input buffer of FIG. 2.

Shown in FIG. 3 is a carry chain 29 and an address buffer 30. Address buffer 30 is comprised generally of a NOR gate 31, an inverter 32, an N channel transistor 33, a latch and driver circuit 34, an N channel transistor 35, and a refresh control circuit 36. NOR gate 31 comprises a P channel transistor 37, a P channel transistor 38, an N channel transistor 39, and an N channel transistor 41. Latch and driver circuit 34 comprises a latch 42, an inverter 43, and an inverter 44. Latch 42 comprises an inverter 46 and an inverter 47. Refresh control circuit 36 comprises a latch 48, a latch 49, an N channel transistor 51, an inverter 52, a P channel transistor 53, an N channel transistor 54, an N channel transistor 55, an N channel transistor 56, and N channel transistor 57. Latch 48 comprises an inverter 58 and an inverter 59. Latch 49 comprises a P channel transistor 61, a P channel transistor 62, an N channel transistor 63, an N channel transistor 64, an N channel transistor 66, and an N channel transistor 67.

A description of how the elements of buffer 30 are connected follows. Transistor 37 has a source connected to a positive power supply terminal VDD for receiving a positive power supply voltage, for example 5 volts, a gate for receiving a first address clock signal *AC1, and a drain. Transistor 38 has a source connected to the drain of transistor 37, a gate for receiving the input address signal $A_{in}$, and a drain connected to a node 71 which is an output of NOR gate 31. Transistor 39 has a drain connected to node 71, a gate for receiving signal $A_{in}$, and a source connected to ground. In present conventional circuits the negative power supply terminal is ground. Transistor 41 has a drain connected to node 71, a gate for receiving signal *AC1, and a source connected to ground. The gates of transistors 37 and 41 form a first input of NOR gate 31, and the gates of transistors 38 and 39 form a second input of NOR gate 31. Inverter 32 has an input connected to node 71 and an output. Transistor 33 has a first current electrode connected to the output of inverter 32 and a second current electrode connected to a node 72 which is an input of latch 42. Inverter 46 has an input connected to node 72, and an output as an output of latch 42. Inverter 47 has an input connected to the output of inverter 46, and an output connected to node 72. Inverter 43 has an input connected to the output of inverter 46, and an output for providing the internal true address signal $A_{out}$ which is the logic true output of buffer 30. Inverter 44 has an input connected to the output of inverter 43, and an output for providing the internal complementary address signal $*A_{out}$ which is the logic complementary output of buffer 30. Transistor 35 has a drain connected to node 72, a source connected to ground, and a gate for receiving an address precharge signal AP.

Carry chain 29 has an input for receiving signal $A_{out}$, and an output for providing a carry signal *CA. Carry chain 29 has other inputs not shown for receiving other buffered address signals. Carry chain 29 provides a specific type of count information. Refresh control circuit 36, latch and driver 34, and carry chain 29 together form a refresh counter which is a portion of counter 13 of FIG. 1. It is an aspect of the invention that a part of the address buffer is used as part of the refresh counter. The use of a carry chain for providing refresh information is well known in the art. The information provided by carry chain 29 as described herein is well known. Transistor 61 has a source connected to the output of inverter 43, a gate connected to the output of carry chain 29, and a drain. Transistor 63 has a drain connected to the drain of transistor 61, a gate connected to the output of carry chain 29, and a source connected to ground. Transistor 62 has a source connected to the output of inverter 44, a gate connected to the output of carry chain 29, and a drain. Transistor 64 has a drain connected to the drain of transistor 62, a gate connected to the output of inverter 13, and a source connected to ground. Transistor 66 has a drain connected to the drain of transistor 61, a gate connected to the drain of transistor 62, and a source connected to ground. The drain of transistor 66 provides a first output of latch 49. Transistor 67 has a drain connected to the drain of transistor 62, a gate connected to the drain of transistor 61, and a source connected to ground. The drain of transistor 67 is a second output of latch 49. Transistor 56 has a gate connected to the drain of transistor 67, a source connected to ground, and a drain. Transistor 57 has a gate connected to the drain of transistor 66, a source connected to ground, and a drain. Transistor 54 has a first current electrode connected to the drain of transistor 56, a control electrode for receiving a second refresh control signal R2, and a second current electrode. Transistor 55 has a first current electrode connected to the drain of transistor 57, a gate for receiving signal R2, and a second current electrode. Inverter 59 has an input connected to the second current electrode of transistor 54, and an output connected to the second current electrode of transistor 55. Inverter 58 has an input connected to the output of inverter 59, and an output connected to the input of inverter 59. Transistor 53 has a source connected to VDD, a gate for receiving a power-up clock signal *PUC, and a drain connected to the input of inverter 58. Inverter 52 has an input connected to the output of inverter 59, and an output. Transistor 51 has a first current electrode connected to node 72, a control electrode for receiving a first refresh control signal R1, and a second current electrode connected to the output of inverter 52.

For a data cycle of DRAM 10, buffer 30 responds in much the same way as buffer 16 except with an improvement in speed and immunity to process variations. The use of a NAND gate in the prior art was because a NAND gate was faster if the input signals were full rail, i.e., were at ground for a logic low and at VDD for a logic high. The NOR gate input of buffer 30 provides less variation in switch point with process variation than a comparable NAND gate. Buffer 30, however, also provides a faster speed buffer than a NAND gate buffer because of the particular way that buffer 30 utilizes a NOR gate as the input gate. In a data cycle, address clock signal AC1 is brought to a logic low, and address clock signal is brought to a logic high. Both of these of transitions are derived from external signal *RAS. In a data cycle, the potentially slowest operation of buffer 30 is for the case in which signals $A_{in}$ and *AC1 simultaneously switch to a logic low. This condition results in NOR gate 31 providing a logic high on node 71 and inverter 32 providing a logic low output which is coupled to node 72 via transistor 33. Transistor 35 is used to precharge node 72 to a logic low which is then latched by latch 42. Node 72 is thus already at a logic low when signals *AC1 and $A_{in}$ switch to a logic low. Thus, the condition which is potentially the slowest is already present by presetting latch 42 to that condition. This results in the conditions which are not preset being driven by N channel transistors 39 and 41 which results in faster operation than that when P channel transistors or other types of loads are used for driving the non-preset condition.

Signal *AC1 will switch to a logic low a little before signal AC2 will switch to a logic high in response to the initiation of a data cycle. This allows NOR gate 31 to resolve address signal $A_{in}$ before coupling the output thereof to node 72. This helps avoid a double transition on node 72. There is another benefit to having separate clock signals for NOR gate 31 and transistor 33. Transistor 33 can be double pulsed, once for the row address and once for the column address, without requiring NOR gate 31 to be double pulsed. With signal *AC1 already at a logic low when signal $A_{in}$ is a column address signal, NOR gate 31 is not nearly so slow for the logic high to logic low transition of signal $A_{in}$. This is because transistor 37 does pass through a high resistivity stage but is already in a high conductivity state. Consequently, it is not necessary to preset latch 42 between the row and column address to avoid the potentially slow condition of buffer 30 for the column address.

Signal AP precharges node 72 and thus presets latch 42 during the time that signal *RAS is inactive which for signal *RAS is when it is a logic high. A cycle for DRAM 10 has two portions, an active cycle and a precharge cycle. The active cycle is initiated by DRAM 10 receiving signal *RAS. The active cycle is terminated and the precharge cycle is initiated in response to signal *RAS becoming inactive. Transistor 35 thus receives signal AP during the precharge cycle. Signal AP is thus also derived from *RAS. Signal AC2 is derived from *RAS also but is not active when signal AP is active. Signal AC2 is also a function of signal *CAS. If signal *CAS becomes active before signal *RAS becomes active, signal AC2 will be inactive during that cycle because such a cycle is a refresh cycle. Signals *AC1 and AC2 can also be a function of signal *CAS by becoming inactive in response to *CAS becoming inactive. Signal AP becomes active during the precharge cycle for both the case in which the preceding active cycle was a data cycle and the case in which the preceding cycle was a refresh cycle. Signal R1 is timed with respect to signal *RAS becoming active in the same way as signal AC2 except that signal becomes active only for a refresh cycle as indicated by signal *CAS becoming active before signal *RAS becomes active.

During the precharge cycle, signals $A_{out}$ and $*A_{out}$ are preset to a logic low and a logic high, respectively, because latch 42 is preset by node 72 being precharged to a logic low. This latch condition of signals $A_{out}$ and $*A_{out}$ may then be changed by NOR gate 31, inverter 32, and transistor 33 if the next cycle is a data cycle or by refresh control circuit 36 if the next cycle is a refresh cycle.

At power-up of DRAM 10, latch 48 is set to provide a logic high output to inverter 52. At power-up, signal *PUC is a logic low pulse which causes transistor 53 to become conductive sufficiently long to set latch 48. Upon the initiation of a refresh cycle, signal R1 switches to a logic high to couple the output of inverter 52 to node 72 to set latch 42. The contents of latch 48 thus determines the logic state of signals $A_{out}$ and $*A_{out}$ for a refresh cycle. The contents of latch 48 are set by the contents of latch 49 during the refresh cycle. Signal R1 is active as a logic low pulse which is of sufficient duration to ensure that latch 42 is set to the state determined by latch 48. After signal R1 has switched back to a logic low but still during the active portion of the refresh cycle, pulse R2 switches to a logic high which causes transistors 54 and 55 to become conductive and will cause state of latch 48 to be flipped if the logic state of latch 48 needs to be changed.

Carry chain 29 determines if the logic state of latch 48 needs to be changed by determining if the logic state of signals $A_{out}$ and $*A_{out}$ need to be changed for the next refresh cycle. This is the procedure by which it is ensured that all of the word lines will be enabled so that all of the memory cells will be refreshed. Carry chain 29 samples the address during the active cycle of the refresh cycle to determine which address signal or signals need to be changed for the next refresh cycle.

Assuming first that the output of buffer 30 did need to be changed for the next refresh cycle, signal *CA will switch to a logic low during the active cycle but after latch 42 has latched the output from latch 48 and signal R1 has switched back to a logic low. With signal *CA at a logic low, transistors 61 and 62 are conductive which couples the logic states of signals $A_{out}$ and $*A_{out}$ to the drains of transistors 66 and 67, respectively. Transistors 66 and 67 form a dynamic cross-coupled latch for the purpose of providing a completely grounded logic low because a P channel transistor provides a logic low at a P channel threshold voltage above ground. Assuming that latch 48 was providing a logic high output to inverter 52 at the beginning of the refresh cycle, then latch 42 would provide a latched logic high output to inverter 43 which would in turn provide signal $A_{out}$ at a logic low. Thus a logic low would be coupled to the gate of transistor 57 via transistor 61 and pulled all the way to ground by transistor 66, and a logic high would be provided to the gate of transistor 56, causing transistor 56 to be conductive. Signal R2 switches to a logic high during the active cycle but after the time signal *CA will have become active if its going to be active. Signal R2 will become active every refresh cycle regardless of the state of signal *CA. With transistor 56 conductive, when signal R2 switches to a logic high, the input of inverter 59 is coupled to ground via transistors 54 and 56 which causes latch 48 to flip states and provide a logic low output to inverter 52. If instead address signal $A_{out}$ was a logic high as a result of latch 48 providing a logic low output to inverter 52, transistor 57 would be conductive because its gate would receive a logic high via transistor 61. Transistor 56 would be non-conductive as a result of receiving a logic low via transistor 62 and further pulled to ground by transistor 67. In such case when signal R2 switched to a logic high, a logic low would be coupled to the input of inverter 58 via transistors 55 and 57 which would cause latch 48 to toggle to a condition in which a logic low is provided to the input of inverter 52.

Latch 48 thus first provides the data for the present refresh cycle and then contains the data for providing the next address for the next refresh cycle. The next cycle may either be a data cycle or a refresh cycle. If it is a data cycle, latch 48 will simply retain its same latched condition. If the next cycle is a refresh cycle, the state of latch 48 will be coupled to latch 42 via inverter 52 and transistor 51 to set the condition for the address signal in determining which word line will be enabled next for refreshing the memory cells connected thereto.

During the precharge cycle following this refresh cycle, signals *CA and R2 are a logic high and logic low, respectively. With signal *CA at a logic high, transistors 61 and 62 are non-conductive and transistors 63 and 64 are conductive. With transistors 63 and 64 conductive, the gates of transistors 56 and 57 are at a logic low which causes transistors 56 and 57 to be non-conductive. Signal *CA will remain at a logic high so long as there is no need to change the state of latch 48. Consequently, transistors 56 and 57 will also remain nonconductive until there is a need to change the state of latch 48. Thus, signal R2 switching to a logic high every refresh cycle does not have any affect on latch 48 unless signal *CA has switched to a logic low during that particular refresh cycle.

Refresh control circuit 36 thus has the next refresh address information stored in a latch which is only one inverter and one coupling device away from the node which is precharged. The internal address signal for refresh is thus provided very quickly and is provided to a large extent along the same path as for the address signal when a data cycle is being run. This is very helpful for providing reliable operation of the row decoders and sense amplifiers which are driven by timing signals. This is further enhanced by signals AC2 and R1 having the same timing relationship with respect to signal *RAS. Thus a valid address, whether for a data cycle or a refresh cycle, becomes valid at node 72 at the same time with respect to signal *RAS switching to a logic low.

We claim:

1. An integrated circuit memory having an array requiring periodic refreshing and having a counter for providing address information for controlling refresh of the array, an input buffer for receiving an external address signal at one of two logic states, comprising:
   a CMOS NOR gate having a first input for receiving a first control signal, a second input for receiving the external address signal, and an output; said NOR gate characterized as providing information, in the form of a logic state on the output, as to the logic state of the external address signal when the first control signal is a logic low;
   first coupling means, having a first input coupled to the output of the NOR gate, a second input for receiving a second control signal, and an output coupled to a precharge node, for coupling a logic state to the precharge node representative of the logic state present on the output of the NOR gate when the second control signal is received; and
   precharge means for precharging, in response to a precharge signal, the precharge node to the logic state which is coupled to the precharge node when the external address signal and the first control signal are a logic low and the second control signal is received by the coupling means.

2. The memory of claim 1 further comprising:
   refresh control means for providing a refresh signal representative of the logic state required for refresh; and
   second coupling means for coupling the refresh signal to the precharge node in response to a refresh control signal, said second control signal and said refresh control signal being mutually exclusive.

3. The memory of claim 2 further comprising:
output means, coupled to the precharge node, for providing complementary buffered address signals responsive to the logic state present on the precharge node.

4. In an integrated circuit memory having an array requiring periodic refreshing, an input buffer for receiving an external address signal at one of two logic states, comprising:
logic buffer means, having a first input for receiving a first control signal, a second input for receiving the external address signal, and an output coupled to a precharge node; said logic gate characterized as providing information, in the form of a logic state on the output, as to the logic state of the external address signal when the first control signal is a first logic state;
precharge means for precharging, in response to a precharge signal, the precharge node to the logic state which is coupled to the precharge node when the address signal and the first control signal are at the first logic state;
latch means, coupled to the first coupling means, for storing a refresh signal;
first coupling means for coupling the refresh signal to the precharge node in response to a refresh control signal;
output means, coupled to the precharge node, for providing complementary buffered address signals responsive to the logic state present on the precharge node.
a carry chain, coupled to the output means, for providing a counter signal if the logic states of the complementary buffered address signals need to be switched, said counter signal being provided after the refresh control signal has been provided; and
latch control means, coupled to the output means, for, in response to the counter signal, sensing the complementary buffered address signals and reversing the logic state of the refresh signal stored in the latch means.

5. The memory of claim 4, wherein the latch means comprises:
a first inverter having an input coupled to the reversal means, and an output coupled to the second coupling means; and
a second inverter having an input coupled to the output of the first inverter, and an output coupled to the input of the first inverter.

6. The memory of claim 5, wherein the latch control means comprises:
a first transistor having a first current electrode for receiving a true one of the complementary buffered address signals, a control electrode for receiving the counter signal, and a second current electrode;
a second transistor having a control electrode coupled to the second current electrode of the first transistor, a first current electrode coupled to a first power supply terminal, and a second current electrode coupled to the input of the first inverter;
a third transistor having a first current electrode for receiving a complementary one of the complementary buffered address signals, a control electrode for receiving the counter signal, and a second current electrode; and
a fourth transistor having a control electrode coupled to the second current electrode of the third transistor, a first current electrode coupled to the first power supply terminal, and a second current electrode coupled to the input of the second inverter.

7. The memory of claim 6 wherein the second current electrode of the second transistor is coupled to the input of the first inverter via a fifth transistor and the second current electrode of the fourth transistor is coupled to the input of the second inverter via a sixth transistor.

8. The memory of claim 7 wherein:
the fifth transistor has a first current electrode coupled to the second current electrode of the second transistor, a control electrode for receiving a refresh update control signal, and a second current electrode coupled to the input of the first inverter; and
the sixth transistor has a first current electrode coupled to the second current electrode of the fourth transistor, a control electrode for receiving the refresh update control signal, and a second current electrode coupled to the input of the second inverter.

9. In an integrated circuit memory having an array requiring periodic refreshing, an input buffer for receiving an external address signal one of two logic states, comprising:
logic buffer means, having a first input for receiving a first control signal, a second input for receiving the external address signal, and an output coupled to an intermediate node; said logic gate characterized as providing information, in the form of a logic state on the output, as to logic state of the external address signal when the first control signal is at a first logic state;
latch means for storing a refresh signal;
first coupling means for coupling the refresh signal to the intermediate node in response to a refresh control signal;
output means, coupled to the intermediate node, for providing complementary buffered address signals responsive to the logic state present on the intermediate node;
a carry chain, coupled to the output means, for providing a counter signal if the logic states of the complementary buffered address signals need to be switched, said counter signal being provided after the refresh control signal has been provided; and
latch control means, coupled to the output means and the latch means, for, in response to the counter signal, sensing the complementary buffered address signals and reversing the logic state of the refresh signal stored in the latch means.

* * * * *

UNITED STATES PATENT AND TRADEMARK OFFICE
CERTIFICATE OF CORRECTION

PATENT NO. : 4,800,531

DATED : January 24, 1989

INVENTOR(S) : Sam Dehganpour, et al

It is certified that error appears in the above-identified patent and that said Letters Patent is hereby corrected as shown below:

Column 9, line 47, change "reversal" to --latch control--.

Column 9, line 48, change "second" to --first--.

Signed and Sealed this

Twenty-fifth Day of July, 1989

Attest:

DONALD J. QUIGG

Attesting Officer

Commissioner of Patents and Trademarks